United States Patent
Havemann et al.

[11] Patent Number: 6,130,156
[45] Date of Patent: Oct. 10, 2000

[54] VARIABLE DOPING OF METAL PLUGS FOR ENHANCED RELIABILITY

[75] Inventors: Robert H. Havemann, Garland; Girish A. Dixit, Plano; Stephen W. Russell, Dallas, all of Tex.

[73] Assignee: Texas Instruments Incorporated, Dallas, Tex.

[21] Appl. No.: 09/281,538

[22] Filed: Mar. 30, 1999

Related U.S. Application Data

[60] Provisional application No. 60/080,289, Apr. 1, 1998.

[51] Int. Cl.[7] .................................................. H01L 21/441
[52] U.S. Cl. .......................... 438/637; 438/627; 438/628; 438/638; 438/653; 438/654
[58] Field of Search ..................................... 438/637, 643, 438/653, 627, 628, 654, 656; 148/438, 439, 403

[56] References Cited

U.S. PATENT DOCUMENTS

| | | | |
|---|---|---|---|
| 3,561,954 | 2/1971 | Brook ...................................... | 148/417 |
| 4,595,429 | 6/1986 | Le Caer et al. .......................... | 148/403 |
| 5,356,836 | 10/1994 | Chen et al. .............................. | 438/627 |
| 5,443,995 | 8/1995 | Nulman ................................... | 438/654 |
| 5,804,251 | 9/1998 | Yu et al. .................................. | 427/250 |
| 5,893,752 | 4/1999 | Zhang et al. ............................. | 438/687 |
| 5,980,657 | 11/1999 | Farrar et al. ............................. | 257/765 |

OTHER PUBLICATIONS

Abstract of EPO 954015A2 from Derwent, Aochi et al., Apr. 21, 1999.

*Primary Examiner*—Matthew Smith
*Assistant Examiner*—Igwe Anya
*Attorney, Agent, or Firm*—Jacqueline J. Garner; W. James Brady, III; Frederick J. Telecky, Jr.

[57] ABSTRACT

A method of fabricating an interconnect wherein there is initially provided a first layer of electrically conductive interconnect (3). A via (7) is formed which is defined by walls extending to the first layer of interconnect. A layer of titanium (9) is formed between the electrically conductive interconnect and the first layer of electrically conductive metal (11). A first layer of electrically conductive metal is formed on the walls of the via having a predetermined etch rate relative to a specific etch species and a second layer of electrically conductive metal (13) is formed on the first layer of electrically conductive metal having an etch rate relative to the specific etch species greater than the first layer and which preferably extends into the via. The first layer of electrically conductive interconnect is preferably aluminum, the first layer of electrically conductive metal is preferably a metal containing from about one percent by weight to about one hundred percent copper and the rest essentially aluminum and the second layer of electrically conductive metal is preferably copper doped aluminum having a lower copper content than the first electrically conductive layer.

38 Claims, 1 Drawing Sheet

VARIABLE DOPING OF METAL PLUGS FOR ENHANCED RELIABILITY

This application claims priority under 35 USC § 119 (e)(1) of provisional application No. 60/080,289, filed Apr. 1, 1998.

BACKGROUND OF THE INVENTION

Field of the Invention

This invention relates to a method for introducing a variable doping into a metal for the purpose of optimizing both reliability and manufacturability of plugs disposed in vias interconnecting layers of interconnect and inlaid metal interconnects.

BRIEF DESCRIPTION OF THE PRIOR ART

Due to the continuing miniaturization of semiconductor devices, tighter design rules are required. A result of these tighter design rules is that there is continually less area for overlap of the metal structure. In the prior art, it has been a rule to insure that a via be surrounded by the metal interconnect to which it must make contact at both the upper and lower levels of the via so that proper contact can be made to multiple levels of interconnect. This luxury has now become less available or has become unavailable in many structures. It is therefore now necessary to utilize zero overlap structures wherein the metal interconnect to which contact is to be made either surrounds only a portion of the via or contacts the via without any portion thereof surrounding the via. This presents a problem since, with misalignment, the interconnect structure within the via may fail to electrically couple adjacent levels of interconnect. This problem has existed in prior art fabrication techniques and therefore becomes more acute in the reliability of metal structures and the vias which are the interface between metal layers.

SUMMARY OF THE INVENTION

In accordance with the present invention, the above described problems inherent in the art are minimized and there is provided a method for introducing a variable doping in a metal layer, preferably but not limited to a chemical vapor deposited (CVD) metal layer, such as, for example, an aluminum layer.

Briefly, there is provided a patterned metal interconnect on a first level which is to be connected to a second level of metal interconnect. The metals which form the interconnect structures are standard and are generally of aluminum, copper, tungsten, etc. A standard dielectric, such as, for example, an oxide, SOG/oxide, etc., is deposited over the underlying metal interconnect layer, planarized, such as with chemical/mechanical polish (CMP), and then a via is patterned and etched in the dielectric down to the underlying patterned metal interconnect layer. The via is then cleaned with care being taken to remove all carbon, preferably including a sputter etch at the bottom of the via in an argon-hydrogen environment. Then a liner of titanium (Ti) is deposited in the via which has a thickness at the bottom of the via of from about 50 angstroms to about 200 angstroms and preferably about 100 angstroms, the titanium also being deposited on the upper exposed surface of the dielectric and along the wall or walls of the via to reduce any oxide that may have formed on the underlying metal interconnect and thereby provide a lower resistance path through the via. There can also be included a barrier layer, such as, for example, titanium nitride (TiN), tantalum (Ta), tantalum nitride (TaN), titanium silicon nitride (TiSiN) and tungsten nitride (WN), over the layer of titanium having a thickness at the bottom of the via of from about 50 angstroms to about 200 angstroms and preferably 100 angstroms. Other materials can be used in place of the titanium, which is the preferred material, these materials being, for example, W, WSiN, WN, Ta, TaN, TiSiN. The titanium reacts with aluminum to form an alloy which increases resistivity. The titanium nitride layer prevents the interaction of the titanium with the aluminum to suppress the alloy formation. The titanium nitride layer can be omitted if the thickness of the titanium layer used is sufficiently small whereby the increase in resistivity due to the alloy formation does not cause a problem. A first layer, preferably of aluminum, though other materials can be used, for example, AlCu, Cu, refractory metals, etc., is then deposited, preferably by CVD into the via and over the titanium and titanium nitride, if used, and the exposed surface of the device being fabricated. The aluminum layer is doped in situ with copper, the copper content being from a finite amount approaching zero up to about two percent by weight with the remainder essentially aluminum. Then a second aluminum layer is deposited, preferably by CVD, over the first layer of copper-doped aluminum. The second aluminum layer is doped in situ with copper but more lightly doped than the first aluminum layer, having a finite amount of copper approaching zero to about one percent by weight with lower values preferred. Alternatively, there can be, for example, a CVD copper layer and then a CVD aluminum layer (the first and second metals can be different). A third layer of metal, preferably AlCu, is then sputter deposited by PVD over the second aluminum layer and then an antireflective coating such as, for example, TiN, is deposited over the PVD layer. The third PVD layer can be omitted if the second aluminum layer is to be used as the second interconnect structure. Conversely, if the first aluminum layer totally fills the via, the second aluminum layer can be omitted and the third layer can be used as the primary interconnect layer. For example, the first and third layers can be copper and PVD aluminum, respectively.

The first layer of aluminum can be replaced by one of a diffusion of copper into aluminum, titanium into aluminum, aluminum into copper, magnesium into copper and many other combinations. The second layer must be etchable at a significantly faster rate than the first layer with respect to a particular species of etchant. For the case of aluminum etching, the first layer should have a high copper (etch impeding) concentration and the second layer should have a lower copper (etch impeding) concentration than the first layer for ease of etching.

Following the lithographic patterning, the above described stack can now be etched with, for example, a standard Cl+BCl$_3$ aluminum etchant. During the etching procedure, the etch will stop or slow down at the regions of heavier copper (etch impeding) doping. If the first metal layer is pure copper, then etching will stop almost completely when the copper layer is reached. This patterns the overlying second and third metal layers. The first metal layer can then be removed by using a different plasma etch, or alternatively, a wet etch that is selective to the second and third metal layers can be used.

The selectivity of the initial plasma etch to the first and second metal layers (or layer 1 in the case of only two metal layers) eases the alignment requirement for the metal lead pattern overlying the via since etching of the via is prevented as long as the second (and third, if used) metal layers overlap the via so as to be at least coincident with the inner edge of the first aluminum layer. If the first metal layer completely fills the via, then the overlying metal lead must only overlap the via enough to provide sufficient electrical connection. This provides tighter design rules since total overlap of the via is not required.

In accordance with a second embodiment, the procedure is the same as described above through formation and cleaning of the via. The process continues with the deposition of a via liner or barrier layer and doped layer along the walls and bottom of the via. A dopant level of up to 5 percent by weight may be used for the doped layer or, alternatively, a pure dopant layer, such as tin or magnesium for copper doping or copper for aluminum doping may be deposited as the doped layer. A second layer of aluminum thereover is more lightly doped (<1 percent by weight) or undoped (such as CVD copper or CVD aluminum) whereas the third layer may be either lightly doped (<1 percent by weight) or heavily doped ($\leq 5$ percent by weight), depending upon the deposition technique which includes electroplating, PVD or CVD. It is noted that it is difficult to dope electroplated and CVD copper in situ. The dopant in the second and/or third layer may thus result from diffusion of dopant from an underlying or overlying layer. The dopant provides reliability improvement such as against electromigration by slowing self diffusion along grain boundaries. Following deposition of the respective layers, the structure is then polished back to provide a planar surface using CMP. If only two layers are provided rather than the three layers as described above, then the first layer would be pure dopant (such as copper for aluminum doping or tin or magnesium for copper doping), preferably deposited by CVD and the second layer, which would complete the filling of the trench, would be a PVD or CVD layer of lightly doped (<1 percent) or undoped copper or aluminum.

Advantages provided by the above described method include enhanced reliability due to providing a means for doping the interconnect layer. An additional advantage is improved selectivity of the CMP to the doped layer by providing a polish stop layer (such as copper for aluminum polish).

DESCRIPTION OF THE PREFERRED EMBODIMENT

Figure 1A:
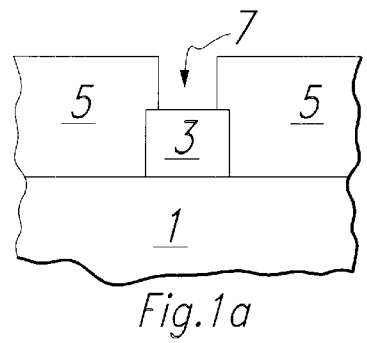
FIGS. 1a, 1b and 1c represent a process flow for the fabrication process in accordance with a first embodiment of the present invention.
Figure 1B:
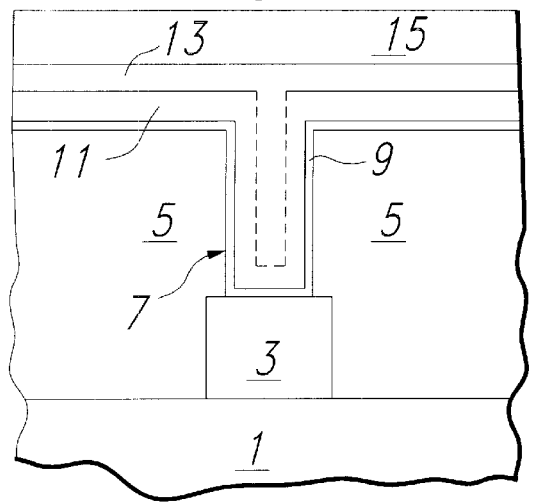

Referring to FIG. 1a, the underlying metal, which is preferably AlCu, is deposited on a dielectric surface 1, patterned and etched to form the underlying interconnect 3. A dielectric 5, such as an oxide, is deposited over the underlying metal interconnect 3 and exposed dielectric surface 1, planarized, such as with chemical/mechanical polish (CMP) and then a via 7 is patterned and etched in the dielectric 5 down to the underlying metal interconnect 3. There must be a good cleanup at the bottom of the via 7, this preferably including a sputter etch at the bottom of the via in an argon-hydrogen environment to further provide removal of carbon residue which may have accumulated at the bottom of the via due to the etching of the dielectric 5. Then a liner of titanium (Ti) 9 is deposited in the via 7, this liner 9 having a thickness of 100 angstroms at the bottom of the via to reduce any oxide that may have formed on the underlying metal interconnect 3 and thereby provide lower via resistance. A layer of titanium nitride (TiN) (not shown in FIGS. 1a and 1b) having a thickness of 100 angstroms is disposed over the layer of titanium 9. The titanium 9 reacts with aluminum to form an alloy which increases resistivity. The titanium nitride layer prevents the interaction of the titanium 9 with the later deposited aluminum to suppress alloy formation. The titanium nitride layer can be omitted if the thickness of the titanium layer 9 is sufficiently small so as not to cause a resistivity problem. CVD aluminum 11 is then deposited into the via 7 and over the layer 9 and titanium nitride layer, if used, as well as the exposed surface of the device. The aluminum layer 11 is doped in situ with copper, the copper content being greater than about one percent by weight. Then CVD aluminum 13 is deposited over the layer of aluminum 11. The aluminum layer 13 is doped in situ with copper but more lightly doped, less than 1 percent and generally 0.5 percent by weight, than the layer 11. Alternatively, there can be a CVD copper layer 11 and then a CVD aluminum layer 13 (first and second metals can be different) . Then a layer of aluminum 15 is sputter deposited by PVD over the layer 13 followed by an antireflective coating over the PVD layer (not shown). This is the stack that can be etched with a chlorine etch such as a plasma of $BCl_3$ and $Cl_2$. During the etch, the etch will stop or slow down at the regions of heavier copper doping 11. If the metal 11 is pure copper, then etching will stop when the copper is reached. This patterns the overlying second and third metal layers 13 and 15. The first metal layer 11 can then be removed by using a different plasma etch, or alternatively, a wet etch that is selective to the second and third metal layers can be used.

The selectivity of the initial plasma etch to the first and second metal layers 11, 13 (or first layer in the case of only two metal layers) eases the alignment requirement for the metal lead pattern overlying the via since etching of the via is prevented as long as the second 13 (and third 15, if used) metal layers overlap the via 7 so as to be at least coincident with the inner edge of the first aluminum layer 11. If the first metal layer 11 completely fills the via 7, then the overlying metal lead 13 must only overlap the via sufficiently to provide adequate electrical connection. This provides tighter design rules since total overlap of the via 7 is not required.

It is envisioned that the vias 7 may be too narrow to permit the deposition therein of two layers, such as layers 11 and 13. In this case, only one layer with the higher doping level would be utilized.

Figure 2A:
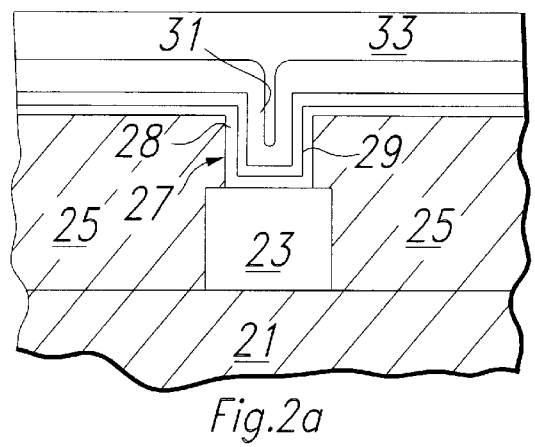
FIGS. 2a and 2b represent a portion of the process flow for the fabrication process in accordance with a second embodiment of the present invention.
Figure 2B:
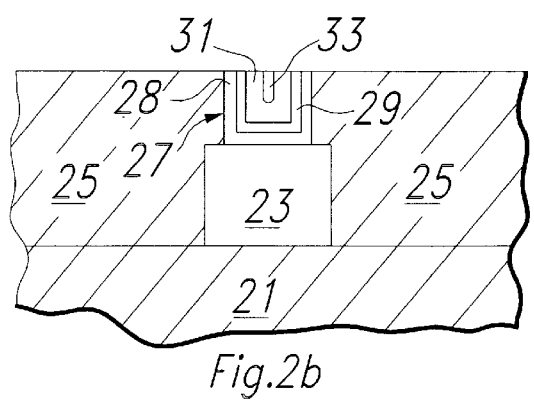
Figure 1C:
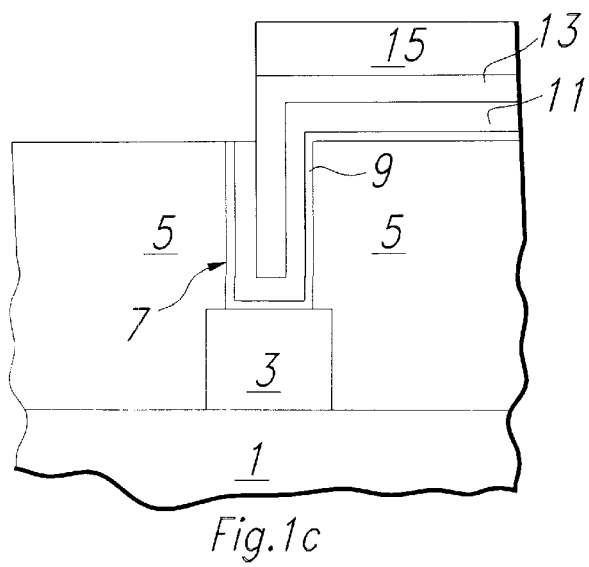

Referring to FIGS. 2a and 2b, there is shown a second preferred embodiment in accordance with the present invention.

Referring to FIG. 2a, the underlying metal, which is preferably AlCu or Cu, is deposited on a dielectric surface 21, patterned and etched to form the underlying interconnect 23. A dielectric 25, such as an oxide, is deposited over the underlying metal interconnect 23 and exposed dielectric surface 21, planarized, such as with chemical/mechanical polish (CMP) and then a via 27 is patterned and etched in the dielectric 25 down to the underlying metal interconnect 23. There must be a good cleanup at the bottom of the via 27, this preferably including a sputter etch at the bottom of the via in an argon-hydrogen environment to further provide removal of carbon residue which may have accumulated at the bottom of the via due to the etching of the dielectric 25. The process continues with the formation of a barrier metal layer 28 and doped layer 29 formed along the walls and bottom of the via. The barrier layer may be, for example, one or more of titanium nitride, tantalum, tantalum nitride, titanium silicon nitride or tungsten nitride. The doped layer may be a pure dopant (such as tin in the case of copper) or an alloy (such as copper and (3%) tin) deposited by PVD or CVD. A second layer 31, a copper seed layer, is then formed in the via 27 over the doped layer 29. A third layer of copper 33 is then deposited by either PVD, CVD or electroplating. For the case of CVD or PVD, the third layer may also be doped, for example, with 1 to 3 percent by weight tin, but in the case of electroplating the third layer will be largely undoped. The structure is then polished back using CMP to provide a planar surface as shown in FIG. 2b. For the case of copper interconnects, the lead is then capped with a dielectric diffusion barrier, such as silicon nitride (not shown), before continuing with further processing. If only two layers are provided rather than the three layers as described above, then the first layer 29, which would fill the via entirely, would be pure copper, preferably deposited by CVD and the second layer 31, which would complete the filling of the trench, would be a PVD layer of doped copper, doped with 1 to 3 percent by weight of tin. Dopant would diffuse into the via region during subsequent thermal anneal.

Figure 2C:
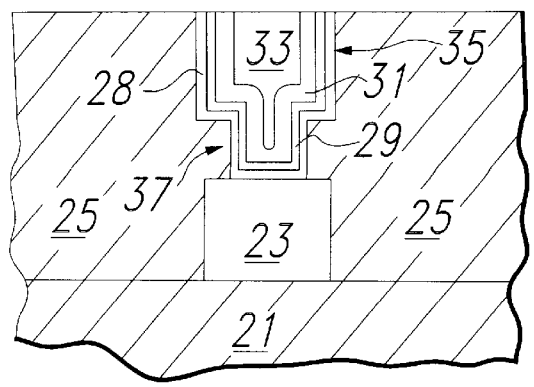
FIG. 2c represents the same process flow as in FIGS. 2a and 2b but with a dual damascene configuration.

In accordance with a third embodiment of the invention using the dual damascene technique as shown in FIG. 2c wherein like reference characters refer to the same or similar structure as that of FIG. 2b, a trench portion 35 is formed which will carry electrical current along a predetermined path defined by the trench portion 35. At a region or regions of the trench 35 above one or more interconnects 23 on a lower level where interconnection is desired, a further via portion 37 is formed the remainder of the way to the interconnects 23 by standard patterning and etching of the dielectric 25 over the interconnect layer 23. Typically, the via 37 is formed first followed by the formation of trench 35, but the order may be reversed, depending upon the process approach. Fabrication is then completed with the formation of a barrier metal layer 28 covering the walls of the trench portions 35 and via portions 37 followed by a doped layer 29 formed along the walls of said trench and via. The doped layer may be a pure dopant (such as tin in the case of copper) or an alloy (such as copper and 3% tin) deposited by PVD or CVD. A second layer 31, a copper seed layer, is then formed in the trench 35 and via 37 over the doped layer 29. A third layer of copper 33 is then deposited to fill the trench 35 and via 37. The third layer 33 may also be doped, for example, with 1 to 3 percent by weight tin, but in the case of electroplating the third layer will be largely undoped. Note that at this point, layers 28, 29, 31 and 33 all extend over the dielectric 25. These layers are then polished back using CMP to provide a planar surface as shown in FIG. 2c. For the case of copper interconnects, the lead is then capped with a dielectric diffusion barrier, such as silicon nitride (not shown), before continuing with further processing. If only two layers are provided rather than the three layers as described above, then the first layer 29 would be pure copper, preferably deposited by CVD and the second layer 31, which would complete the filling of the trench, would be a PVD layer of doped copper, doped with 1 to 3 percent by weight of tin. Dopant would diffuse into the via region during subsequent thermal anneal.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

What is claimed is:

1. A method of fabricating an interconnect comprising the steps of:
   (a) providing a first layer of electrically conductive interconnect;
   (b) forming a via defined by walls extending to said first layer;
   (c) forming a first layer of electrically conductive metal on the walls of said via having a predetermined etch rate relative to a specific etch species; and
   (d) forming a second layer of electrically conductive metal on said first layer having an etch rate relative to said specific etch species greater than said first layer.

2. The method of claim 1 wherein said second layer extends into said via.

3. The method of claim 2 further including the step of etching said first and second layers with an etchant that etches said second layer at a faster rate than said first layer.

4. The method of claim 3 further including the step of providing a layer of titanium between said electrically conductive interconnect and said first layer of electrically conductive metal.

5. The method of claim 4 wherein said first layer of electrically conductive interconnect is aluminum, said first layer of electrically conductive metal is a metal containing from about one percent by weight to one hundred percent copper and the rest, if any, essentially aluminum and said second layer of electrically conductive metal is copper doped aluminum having a lower copper content than said first electrically conductive layer.

6. The method of claim 5 further including the step of providing a third layer of electrically conductive interconnect on said second layer of electrically conductive metal.

7. The method of claim 4 further including the step of providing a third layer of electrically conductive interconnect on said second layer of electrically conductive metal.

8. The method of claim 3 wherein said first layer of electrically conductive interconnect is aluminum, said first layer of electrically conductive metal is a metal containing from about one percent by weight to one hundred percent copper and the rest, if any, essentially aluminum and said second layer of electrically conductive metal is copper doped aluminum having a lower copper content than said first electrically conductive layer.

9. The method of claim 3 further including the step of providing a third layer of electrically conductive interconnect on said second layer of electrically conductive metal.

10. The method of claim 2 further including the step of providing a layer of titanium between said electrically conductive interconnect and said first layer of electrically conductive metal.

11. The method of claim 10 wherein said first layer of electrically conductive interconnect is aluminum, said first layer of electrically conductive metal is a metal containing from about one percent by weight to one hundred percent copper and the rest, if any, essentially aluminum and said second layer of electrically conductive metal is copper doped aluminum having a lower copper content than said first electrically conductive layer.

12. The method of claim 2 wherein said first layer of electrically conductive interconnect is aluminum, said first layer of electrically conductive metal is a metal containing from about one percent by weight to one hundred percent copper and the rest, if any, essentially aluminum and said second layer of electrically conductive metal is copper doped aluminum having a lower copper content than said first electrically conductive layer.

13. The method of claim 1 further including the step of etching said first and second layers with an etchant that etches said second layer at a faster rate than said first layer.

14. The method of claim 13 further including the step of providing a layer of titanium between said electrically conductive interconnect and said first layer of electrically conductive metal.

15. The method of claim 14 wherein said first layer of electrically conductive interconnect is aluminum, said first layer of electrically conductive metal is a metal containing from about one percent by weight to one hundred percent copper and the rest, if any, essentially aluminum and said second layer of electrically conductive metal is copper doped aluminum having a lower copper content than said first electrically conductive layer.

16. The method of claim 13 wherein said first layer of electrically conductive interconnect is aluminum, said first layer of electrically conductive metal is a metal containing from about one percent by weight to one hundred percent copper and the rest, if any, essentially aluminum and said second layer of electrically conductive metal is copper doped aluminum having a lower copper content than said first electrically conductive layer.

17. The method of claim 1 further including the step of providing a layer of titanium between said electrically conductive interconnect and said first layer of electrically conductive metal.

18. The method of claim 17 wherein said first layer of electrically conductive interconnect is aluminum, said first layer of electrically conductive metal is a metal containing from about one percent by weight to one hundred percent copper and the rest, if any, essentially aluminum and said second layer of electrically conductive metal is copper doped aluminum having a lower copper content than said first electrically conductive layer.

19. The method of claim 1 wherein said first layer of electrically conductive interconnect is AlCu, said first layer of electrically conductive metal is a metal containing from about one percent by weight to one hundred percent copper and the rest, if any, essentially aluminum and said second layer of electrically conductive metal is copper doped aluminum having a lower copper content than said first electrically conductive layer.

20. The method of claim 1 further including the step of providing a third layer of electrically conductive interconnect on said second layer of electrically conductive metal.

21. The method of claim 1 wherein said first layer of electrically conductive metal is a metal containing from about 0.5 percent by weight to one hundred percent copper and the rest, if any, essentially at least one of tin and magnesium and said second layer of electrically conductive metal is copper doped with at least one of tin and magnesium in the amount of from about 0.1 to less than 100 percent by weight.

22. The method of claim 21 further including the step of forming a third layer of copper doped with at least one of tin and magnesium over said second layer.

23. The method of claim 22 wherein said first layer of electrically conductive interconnect is one of Cu or AlCu.

24. The method of claim 21 wherein said first layer of electrically conductive interconnect is one of Cu or AlCu.

25. The method of claim 1 further including the step of forming a barrier layer beneath said first layer of electrically conductive metal.

26. The method of claim 25 wherein said barrier layer is at least one of titanium nitride, tantalum, tantalum nitride, titanium silicon nitride or tungsten nitride.

27. A method of fabricating an interconnect comprising the steps of:
(a) providing a first layer of electrically conductive interconnect;
(b) forming a via defined by walls extending to said first layer;
(c) depositing a pure dopant layer on the walls of said via;
(d) forming a second layer of copper or aluminum over said dopant layer which is more lightly doped than said doped layer or undoped; and
(e) forming a third layer of one of doped copper or aluminum over said second layer.

28. The method of claim 27 wherein said dopant layer is formed from a material taken from the class consisting of tin or magnesium for copper doping or copper for aluminum doping.

29. A method of fabricating an interconnect comprising the steps of:
(a) providing a first layer of electrically conductive interconnect;
(b) forming a via defined by walls extending to said first layer;
(c) forming a first layer of electrically conductive metal on the walls of said via taken from the class consisting of copper for aluminum doping or tin or magnesium for copper doping; and
(d) forming a second layer of electrically conductive metal on said first layer of doped or undoped copper or aluminum having a lower level of doping than said first layer.

30. The method of claim 29 wherein said second layer extends into said via.

31. A method of fabricating an interconnect comprising the steps of:
(a) providing a first layer of electrically conductive interconnect;
(b) forming an aperture defined by walls and extending to said interconnect;
(c) forming a barrier layer extending over said interconnect and said walls; and
(d) forming one of a dopant layer or a doped layer of an electrically conductive metal over said barrier layer and within said aperture.

32. The method of claim 31 wherein said aperture includes a trench having a first cross section over a via having a second cross section with an area less than said first cross section, said via contacting said interconnect.

33. The method of claim 31 further including forming an electricaly conductive layer over said one of a dopant layer or a doped layer of an electrically conductive metal.

34. The method of claim 33 wherein said dopant layer is tin and said electrically conductive layer is copper.

35. The method of claim 33 wherein said electrically conductive metal is a mixture of copper and tin.

36. The method of claim 34 further including the step of forming a further doped electrically conductive layer over said electrically conductive layer.

37. The method of claim 35 further including the step of forming a further doped electrically conductive layer over said electrically conductive layer.

38. The method of claim 33 further including the step of forming a further doped electrically conductive layer over said electrically conductive layer.

* * * * *